United States Patent [19]

Daughtry et al.

[11] Patent Number: 5,337,020

[45] Date of Patent: Aug. 9, 1994

[54] DIFFERENTIAL RADIO FREQUENCY DETECTOR/COMPARATOR FOR POWER LEVEL CONTROL

[75] Inventors: Earl A. Daughtry, Lawrenceville; Richard M. Stone, Duluth, both of Ga.

[73] Assignee: Matsushita Communication Industrial Corporation of America, Peachtree City, Ga.

[21] Appl. No.: 30,789

[22] Filed: Mar. 12, 1993

[51] Int. Cl.[5] .............................................. H03G 3/30
[52] U.S. Cl. ....................................... 330/279; 330/280
[58] Field of Search ............... 330/129, 138, 279, 280; 329/352, 363, 364; 455/116, 126, 127; 328/26; 307/261

[56] References Cited

U.S. PATENT DOCUMENTS 4,724,337 2/1988 Maeda et al. .................. 330/256 X

FOREIGN PATENT DOCUMENTS

| 73116 | 6/1980 | Japan | 330/280 |
| 39114 | 3/1984 | Japan | 330/279 |
| 7616 | 6/1984 | Japan | 330/138 |
| 100013 | 5/1986 | Japan | 330/279 |

*Primary Examiner*—James B. Mullins
*Attorney, Agent, or Firm*—Jones & Askew

[57] ABSTRACT

An automatic level control circuit for radio frequency power amplifiers which is immune to temperature and power supply induced variations. The level control circuit (42) employs a detector/comparator comprising a matched transistor pair (55) operating as a detecting differential amplifier to compare a reference signal (63) to the output power signal (83). A second amplifier (60) receives the differential output signals from the detecting amplifier and provides a power level control signal (97) to the power amplifier, thereby causing the power amplifier to produce the desired output power level.

8 Claims, 2 Drawing Sheets

DIFFERENTIAL RADIO FREQUENCY DETECTOR/COMPARATOR FOR POWER LEVEL CONTROL

Technical Field

The present invention relates generally to power level control circuits for radio frequency power amplifiers and, more particularly, relates to automatic power level control circuits that are substantially immune to temperature variations.

BACKGROUND OF THE INVENTION

In cellular telephones, the output power of the radio frequency ("RF") power amplifier is automatically selected from a plurality of discrete power levels. By selecting the lowest effective output power level and controlling the output power, the transmitting range of a cellular telephone may be carefully limited so that radio channels may be reused throughout the cellular system and the capacity of the system may be maximized. Since cellular telephones are used year round in a variety of different environments, it is necessary to accurately control the output power within specified tolerances over a broad range of operating temperatures.

In most cases, radiotelephones employ feedback circuits to control the output of the power amplifier. A portion of the RF output energy is applied to a detector circuit, which provides a power level signal corresponding to the output power level. The power level signal is compared to a reference signal in order to generate a control signal. The control signal is then used to vary the amplifier's output power and cause the difference between the reference signal and the power level signal to be minimized.

Most prior art transmitters that incorporate RF output power control use some form of diode detector to convert the RF carrier to a corresponding DC level. If the detector requires good sensitivity to low level RF voltages, then almost invariably the diode detector is forward biased. This forward bias generates a DC voltage drop across the diode. The DC voltage drop will vary with temperature by approximately $-2.5$ millivolts/degree C. Thus, over a $-30°$ C. to $+60°$ C. range, the output voltage can change 225 millivolts. Consequently, the level of the power-control signal varies as the temperature varies. This in turn causes the output of the RF amplifier to change even though the reference signal remains constant.

Several methods of compensating for these temperature induced variations are known in the art. In one method, the output from the RF amp is half-wave rectified by a first diode and a capacitor. The voltage at the anode of the first diode is biased to a predetermined voltage by means of circuitry that includes a second diode. If the first and second diodes exhibit similar temperature characteristics, the variation in voltage drop across the second diode will alter the forward bias voltage of the first diode and minimize variations in the detector output voltage level. An example of this method is described in U.S. Pat. No. 4,523,155 to Walczak et al. One drawback of this method is the relative difficulty and expense associated with selecting and matching each pair of diodes. In addition, there are practical limits on the manufacturer's ability to match the diodes and the ability to subject both diodes to the same ambient temperatures in the presence of other components.

In a second method, the output of a comparator is used to control the output power of the amplifier. A signal corresponding to the output power is rectified by a diode detector. This rectified signal is fed into one of the comparator inputs. A reference signal is fed into the other comparator input. Each of the comparator inputs has a biasing diode connecting it to ground. The biasing diodes are in close thermal contact on the same chip. This has the effect of reducing the thermal coefficient of the diode detector and the variations in the detector output voltage due to temperature. This approach is illustrated in U.S. Pat. No. 4,992,753 to Jenson et al. However, this circuit is subject to some temperature induced variations since the diode detector is not thermally compensated and does not match the biasing diodes. In addition, the diode detector is not forward biased and will exhibit non-linear characteristics at low output voltages.

In a third approach, the output of the power amplifier is sampled and is amplitude modulated at a preselected frequency. The detector circuitry produces signals whose amplitude is indicative of the RF amplifier's output power and whose frequency is the modulation frequency. The amplitude of the lower frequency waveform corresponds to the amplitude of the RF amplifier output power. An error signal, generated by comparing the lower frequency signal to a reference voltage, is used to control the RF amplifier. In this arrangement, the amplitude of the lower frequency signal is independent of the quiescent voltage drop across the detector diode. Although the amplitude is dependent upon the rectification efficiency of the diode, this effect is only slightly temperature dependent. Thus, there is very little effect from temperature changes. This method is illustrated in U.S. Pat.No. 5,003,270 to Braathen et al. This approach requires more complicated circuitry and a larger number of parts than other approaches.

Thus, there is a need in the art for an improved RF detector for power level control that effectively minimizes variations due to temperature and employs a simple circuit design that may be easily and inexpensively manufactured.

In addition, diode detector circuits do not provide any amplification of the detected signal and do not perform the comparison between the detected signal and the reference signal. Therefore, there is a need for an amplifying RF detector/comparator so as to reduce the number and/or gain of subsequent stages.

SUMMARY OF THE INVENTION

The present invention overcomes the above-described problems in prior art output control circuitry by providing a circuit that effectively eliminates temperature induced variations in the RF power amplifier's output signal. Such a circuit is easily manufactured and obviates diode detectors common to prior art circuits.

Generally described, the present invention provides a circuit for generating a control signal that may be used to alter the output power of an RF power amplifier. The circuit includes a first detector/amplifier having one input connected to a reference signal and another input functionally connected to the output of the power amplifier. The first amplifier has two complementary outputs. Either of the complementary outputs may be selected to provide the control signal.

More particularly described, the present invention provides a circuit wherein the first amplifier includes a matched differential pair of transistors, each having a base, an emitter, and a collector. The base of the first transistor is connected to the reference signal, and the collector is connected to the first complementary output. The base of the second transistor is functionally connected to the output of the power amplifier and the collector is connected to the second complementary output. The emitters are connected to each other and the transistors share a common substrate.

Preferably, the circuit of the present invention also includes a first resistor and first capacitor. The resistor and capacitor are connected in parallel between the emitters of the matched differential pair and a first source of operating voltage, such as signal ground. In this manner, the signal corresponding to the output power is rectified across the base-emitter junction of the second transistor. The circuit of the present invention also includes a second resistor connected between the collector of the first transistor and a second source of operating voltage, such as a positive DC voltage. A third resistor is connected between the collector of the second transistor and the second source of operating voltage. A second capacitor is connected between the collector of said first transistor and the first source of operating voltage, and a third capacitor is connected between the collector of said second transistor and the first source of operating voltage. The capacitors are operative to attenuate the AC component of the output signals at said first and second complementary outputs.

More particularly described, the circuit includes a second amplifier, which is a a high gain linear amplifier. The preferred second amplifier is an operational amplifier having an inverting input, a non-inverting input, and an output. One of the inputs is connected to the first complementary output of the first amplifier. The other input is connected to the second complementary output of the first amplifier. The output of the second amplifier provides the control signal.

The present invention also provides a method for controlling the output power of an RF power amplifier. Generally described, the output power is controlled by providing a reference signal corresponding to the desired output level; providing an RF signal corresponding to the output of said RF amplifier; generating two complementary output signals by comparing the reference signal and the rectified RF signal; and adjusting the output power of the power amplifier in response to one of the complementary signals.

Thus, it is an object of the present invention to provide a method for controlling the output power of an RF power amplifier.

It is a further object of the present invention to provide a circuit that is independent of operating temperature for controlling the output power of an RF power amplifier.

It is a further object of the present invention to provide a signal that does not fluctuate with variations in operating temperature for controlling an RF power amplifier.

It is a further object of the present invention to provide a temperature independent circuit for controlling the output of an RF power amplifier, that obviates the diode detectors of the prior art.

Also more particularly described, the circuit uses a pair of transistors, connected as a differential amplifier, to detect and amplify the incoming RF signal and compare it to a reference signal.

Therefore, it is a further object of the present invention to provide an amplifying RF detector so as to reduce the number and/or gain of the stages needed after detection of the incoming RF signal.

Other objects, features, and advantages of the present invention will become apparent upon reading the following detailed description of the embodiments of the invention, when taken in conjunction with the accompanying drawings and appended claims.

DETAILED DESCRIPTION OF THE PREFERRED EMBODIMENT

Figure 1:
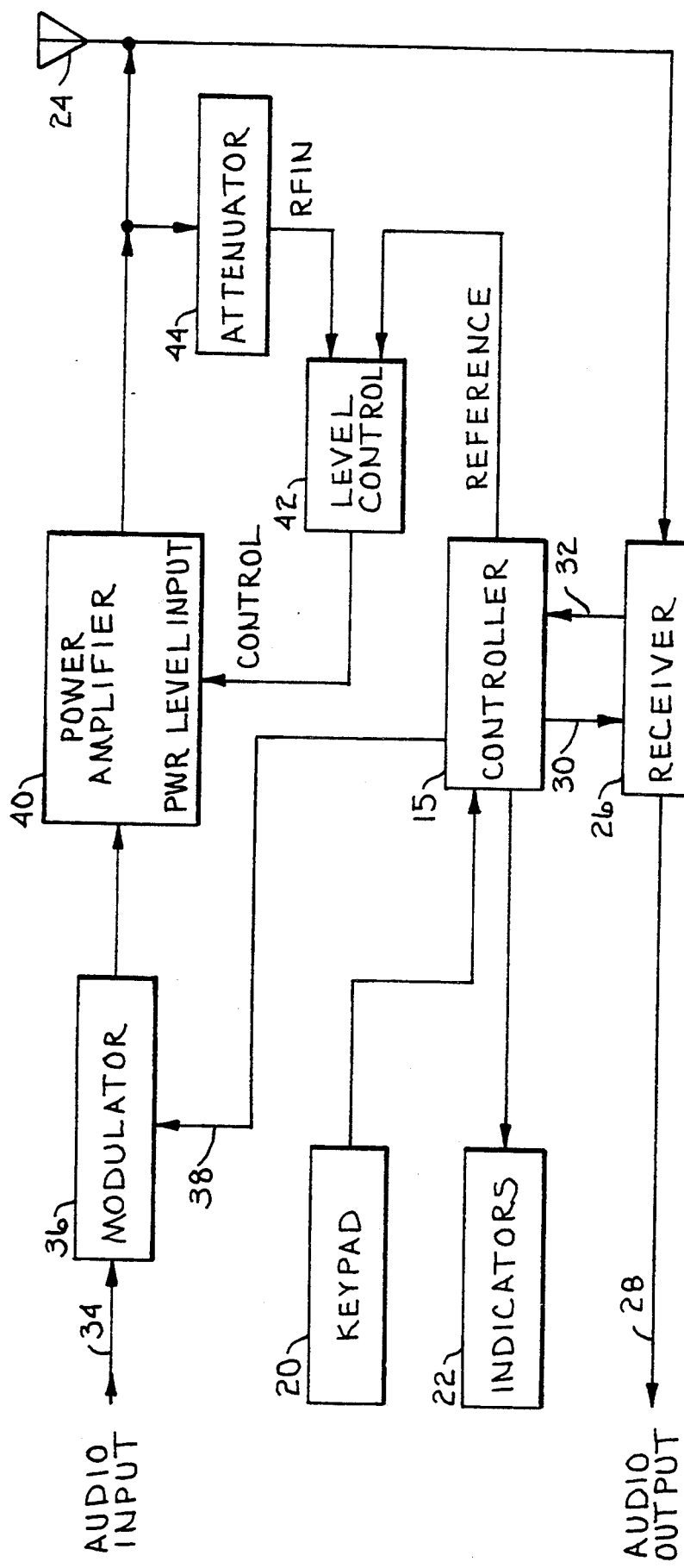
FIG. 1 is a block diagram of a radiotelephone incorporating the differential RF detector/comparator of the present invention.

Referring now in detail to the drawings, in which like numerals refer to like parts throughout the several views, FIG. 1 shows a block diagram of a radiotelephone that incorporates a power level control circuit embodying the differential RF detector/comparator of the present invention. Although the present invention is described in conjunction with a cellular mobile radio telephone system, those skilled in the art will understand that the present invention need not be so limited, and may find uses in communication systems of other types. The radiotelephone 10 includes a controller 15 that includes a microprocessor and other ancillary circuitry (not shown) needed to control the operation of the radiotelephone 10. In the preferred radiotelephone, the ancillary circuitry includes a digital-to-analog converter so that controller 15 can generate an analog REFERENCE signal.

The controller 15 receives user inputs from a keypad 20. In addition to the digits constituting a telephone number to be called, the input from the keypad 20 may include data pertaining to the operation of the radiotelephone, such as volume control, storage of the telephone numbers, and the like. The controller 15 also is connected to indicators 22. These may include alphanumeric displays, miscellaneous indicators and tone generators.

RF signals received via antenna 24 are fed into the receiver 26. The receiver 26 demodulates the RF signals and provides an audio output at point 28. The receiver 26 and controller 15 are connected as indicated by arrows 30, 32. Commands indicating, among other things, the appropriate channel and power level are received from the host Mobile Telephone Switching Office (MTSO) (not shown) via antenna 24 and receiver 26 and are provided to the controller 15. Likewise, the controller 15 provides data to the receiver 26 indicating the desired audio gain and proper channel selection so that the received signal will be properly tuned in and demodulated.

Audio input, such as speech, is received at point 34. This is provided to modulator 36 where a modulated signal is generated in accordance with the channel selection information provided to the modulator 36 by the controller 15 via the connection indicated by arrow 38. The modulated signal is then provided to the power amplifier 40, where it is amplified to a predetermined power level and provided to the antenna 24.

As will be described more completely below, the level control circuit 42 provides a power level control signal that is used to control the output power provided by power amplifier 40. The level control circuit 42 receives a reference signal from the controller 15. The reference signal is indicative of the desired output level. The level control circuit 42 also receives an RF signal corresponding to the output of the power amplifier 40. An attenuator 44 may be interposed between the output of the power amplifier 40 and the input of the level control circuit 42 to insure that the signal level is compatible with the allowable input voltage range of level control circuit 42. By comparing the REFERENCE signal with the actual output power level, the control circuit 42 provides a control signal to the power amplifier 40 that indicates whether the gain of the amplifier 40, and therefore the output power level, needs to be increased or decreased in order to match the power level selected by controller 15.

Those skilled in the art will understand that the RF power amplifier in a cellular telephone is operated at one of a plurality of discrete power levels. The desired power level is selected by the microprocessor in controller 15 in response to signals received from the MTSO in the cellular telephone system in which the telephone is operating. A digital-to-analog converter (not shown) in controller 15 converts a digital signal from the microprocessor into the analog REFERENCE signal that is used to control the output of the RF amplifier via level control circuit 42.

The analog REFERENCE signal specified by the microprocessor and an RF signal corresponding to the output of the RF amplifier 40 are fed into the level control circuit 42. A control signal is generated by detecting the RF signal and comparing the detected (rectified) RF signal to the REFERENCE signal. The RF amplifier output is then varied in response to the control signal until the RF signal corresponds to the RF power level specified by the REFERENCE signal. In this manner, the output of the RF amplifier follows the REFERENCE signal generated by the microprocessor.

Figure 2:
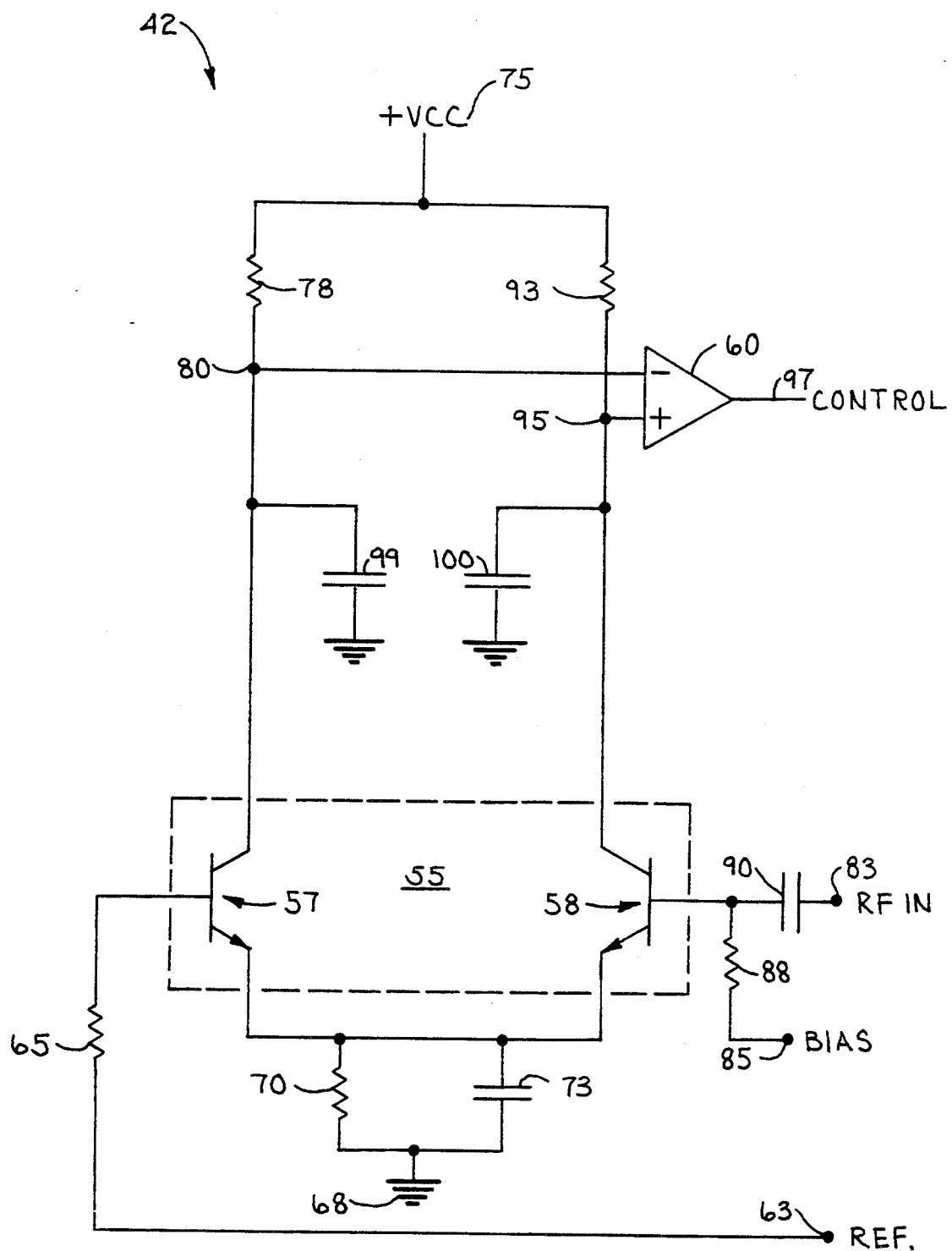
FIG. 2 is a schematic diagram of a differential RF detector/comparator constructed in accordance with the preferred embodiment of the present invention.

Turning now to FIG. 2, the preferred level control circuit 42 will be described. The level control circuit 42 includes a matched differential transistor pair 55. The matched differential transistor pair 55 is a single package that includes two bipolar junction transistors 57, 58 manufactured on a single substrate so as to be closely matched. If transistors 57, 58 are not on the same substrate then they should be selected so as to match as closely as possible in terms of their electrical and thermal characteristics. The preferred matched differential pair 55 is type FMW8, manufactured by Rohm Co. Ltd. of Kyoto, Japan. The level control circuit 42 also includes a high gain operational amplifier 60.

The REFERENCE signal from the controller 15 is provided at point 63, and is connected to the base of transistor 57 through a 12 k ohm current limiting resistor 65. The emitter of transistor 57 is connected to ground 68 through the parallel combination of a 4.7 k ohm resistor 70 and a 100 picofarad bypass capacitor 73. The collector is connected to +VCC 75 through an 8.2 k ohm resistor 78. The voltage at the collector of transistor 57 forms the first differential or complementary output, indicated at point 80. The voltage drop across resistor 78 is determined by the amount of current flowing through transistor 57. The first differential voltage at point 80 will equal the voltage +VCC less the voltage drop across the resistor 78. In the preferred embodiment, the REFERENCE signal will range from 0.1 to 4.9 volts, and +VCC is approximately 7.5 volts. These values are not critical and other values may be used.

The base of transistor 58 is connected through a 100 picofarad DC blocking capacitor 90 to the RF IN signal at point 83, and through a 12 k ohm current limiting resistor 88 to the DC BIAS voltage at point 85. The REFERENCE voltage and the BIAS voltage are selected so as to bias the transistor 58 into the cutoff region and provide a nonlinear response to the signal RF IN. The signal RF IN is a radio frequency signal that corresponds to the output of the power amplifier 40 as attenuated by attenuator 44. The emitter is connected to the emitter of transistor 57 and to resistor 70 and capacitor 73. The collector is connected to +VCC 75 through an 8.2 k ohm resistor 93. The voltage on the collector of transistor 58 forms the second differential or complementary output, indicated at point 95. The voltage drop across resistor 93 is determined by the amount of current flowing through transistor 58. The second differential voltage at point 95 will equal the voltage +VCC less the voltage drop across resistor 93. If the signal RF IN is sufficient to cause transistor 58 to conduct then this signal is rectified or detected across the base-emitter junction of transistor 58. This rectified RF signal appears at the second differential output 95. In addition, because transistors 57, 58 are connected in a differential amplifier configuration, the signal at the first differential output 80 will be the complement of the signal at the second differential output 95. Since first and second differential outputs 80, 95 are equally affected by temperature variations they are balanced signals with respect to temperature but, as they are oppositely affected by variations in the input signal at point 83, the signals 80, 95 may also be referred to as differential signals or complementary signals. Transistors 57, 58 may also be viewed as a detecting amplifier, with an inverting output at 95 and a non-inverting output at 80.

The first and second differential outputs 80, 95 are also connected to ground through bypass capacitors 99, 100. The capacitors 99, 100 help reduce any high frequency component resulting from detection of the signal RF IN. The first and second differential outputs 80, 95 are connected to the inverting and noninverting inputs, respectively, of amplifier 60. The amplifier 60 is operating as a linear amplifier at full gain and provides a control signal that is used to vary the output of the RF amplifier 40. The control signal is provided at point 97. Those skilled in the art will understand that the amplifier 60 is not necessary to the present invention, and that either of the differential outputs 80, 95 may be used to control the power amplifier 40 if the control input of the power amplifier is sufficiently sensitive. However, the inventors believe that the addition of the amplifier 60 is advantageous in that it provides an amplified, single-ended or unbalanced signal which is more stable over temperature, and which may be readily applied to a ground-referenced power amplifier.

Consider now the operation of the preferred embodiment of the preferred level control circuit 42. Assume first that the controller 15 places a first REFERENCE voltage V1 at point 63, that V1 is greater than the BIAS voltage V2 at point 85, and that there is no RF power output from amplifier 40. Also assume that the difference between voltages V1 and V2 is such that transistor 57 draws most or all of the current available through emitter resistor 70 so that transistor 58 is drawing little or no current. The collector voltage at point 80 will be lower than the collector voltage at point 95, therefore the output of amplifier 60 will be driven to its most positive output voltage. This instructs RF amplifier 40 to increase its output power. As the output power increases, the positive tips of the RF waveform will begin to cause transistor 58 to conduct. This causes transistor 58 to draw some of the available current away from transistor 57. Therefore, the collector voltage at point 80 begins to rise because there is less current flowing through resistor 78 and so there is a lesser voltage drop across resistor 78. At the same time, the collector voltage at point 95 begins to drop because there is more current flowing through resistor 93 and therefore a greater voltage drop.

As the power output of amplifier 40 continues to increase, more and more of the positive-going portion of the RF waveform will cause transistor 58 to conduct and the increased RF input voltage will cause more base current to flow in transistor 58 during those positive-going portions, thereby causing the collector voltage at point 80 to increase more and more and causing the collector voltage at point 95 to decrease more and more. At some level of RF power output transistors 57 and 58 will draw approximately the same amount of current and so the collector voltages at points 80 and 95 will be approximately equal. At this point the inputs to amplifier 60 will be approximately equal and the output of amplifier 60 will decrease to a point where the signal provided to RF amplifier 40 causes RF amplifier 40 to produce just enough power to cause the currents through transistors 57 and 58 to be approximately equal, but just unequal enough to cause amplifier 60 to provide this signal to RF amplifier 40.

If the output of RF amplifier 40 is excessive then transistor 58 will draw more current than transistor 57, the collector voltage at point 80 will be greater than the collector voltage at point 95, the non-inverting input to amplifier 60 will be less positive than the the inverting input to amplifier 60, and the output of amplifier 60 will be driven toward its least positive point, thereby sending a signal to RF amplifier 40 that the output power or gain should be reduced. Once RF amplifier 40 reduces its output power to the correct level then the collector voltages at points 80 and 95 will again be approximately equal, the inputs to amplifier 60 will be approximately equal, and the output of amplifier 60 will increase to a point where the signal provided to RF amplifier 40 causes RF amplifier 40 to produce just enough power to cause the currents through transistors 57 and 58 to be just unequal enough to cause amplifier 60 to provide the necessary signal to RF amplifier 40.

Assume now that controller 15 receives, via receiver 26, a signal from the mobile telephone switching office (MTSO) (not shown) which indicates that the output power should be increased. Controller 15 will then increase the REFERENCE voltage 63 to the level appropriate for the desired power level. This means that a higher RF output will be required in order to cause transistor 58 to begin conducting and to draw the same current as transistor 57. Therefore, amplifier 60 will send a signal to amplifier 40 which causes amplifier 40 to increase its RF output power or gain until the actual output power is the desired output power.

Assume now that controller 15 receives a signal from the MTSO which indicates that the output power should be decreased. Controller 15 will decrease the REFERENCE voltage to the level appropriate for the lower power level. This will cause transistor 58 to conduct substantially more current than transistor 57, thereby causing amplifier 60 to change the control signal to amplifier 40 in a manner which causes amplifier 40 to reduce its output power or gain.

It will be seen from the above that the output power level can be controlled by adjusting the REFERENCE voltage so that more power or less power, as desired, is needed to cause the current drawn through transistor 57 to be approximately equal to the current drawn through transistor 58.

It will be appreciated from the above that the RF power level is determined by the difference between the REFERENCE and BIAS voltages. Therefore, even though the preferred embodiment varies the REFERENCE voltage, it is possible to achieve the same operative result by varying the BIAS voltage, or by varying both the REFERENCE voltage and the BIAS voltage. Likewise, it will be appreciated that the same operative result may be accomplished by maintaining a constant REFERENCE voltage and varying the degree of attenuation provided by the attenuator 44. This may be accomplished by providing a variable attenuator that is controlled by a signal from the controller 15.

Transistor 58, because it only conducts during the more positive portions of the RF waveform, acts as a detector. Transistors 57 and 58, in conjunction, perform as an amplifier which amplifies the detected signal and provides a detected signal which is greater than that which can be obtained using only, for example, a diode to perform the detection. Capacitors 99 and 100, in conjunction with resistors 78 and 93, act as low pass filters so that the collector voltages are those caused by the average current flow through transistors 57 and 58. This allows the use of a low bandwith amplifier for amplifier 60, rather than having to use a wide bandwidth amplifier.

It should be understood that, in the preferred embodiment, the CONTROL output of amplifier 60 is not a logical output ("0" or "1") but is an analog output and amplifier 60 preferably operates in its linear region, although non-linear or saturated operation may briefly occur when switching from a very low power level to a very high power level, or vice versa.

Transistors 57 and 58 are preferably manufactured as identically as possible, and on the same substrate. Therefore, if there is a change in the temperature or the power supply voltage the change will affect both transistors equally, change the characteristics of both equally, and, because the transistors are connected in a differential amplifier configuration, will cause little or no change between the collector voltages because both collector voltages will change the same amount in the same direction. Therefore, the present invention provides a power level control circuit that is substantially immune to temperature variations.

Also, changes in the power supply voltages will affect the collector voltages equally, thereby providing immunity from power supply variations.

Although ranges have been provided for the values of the components and voltages described above, those skilled in the art will also understand that each radio telephone constructed in accordance with the present invention will be calibrated to insure its compliance with the applicable guidelines regarding radiated RF energy. Thus, the values of the resistors and capacitors described herein will be chosen so that the reference signal 63 causes the RF power amplifier to provide the proper amount of radiated energy for each of the discrete power levels chosen by the microprocessor.

While this invention has been described in detail with particular reference to preferred embodiments thereof, it will be understood that variations and modifications can be effected within the spirit and scope of the invention as described hereinbefore and as defined in the appended claims.

What is claimed is:

1. A circuit for providing a control signal to select the output power of a radio frequency (RF) amplifier, comprising:
    a first transistor having a base, an emitter, and a collector, said base being connected to a reference signal, and said collector providing a first complementary output;
    a second transistor having a base, an emitter, and a collector, said base being functionally connected to the output of said RF amplifier, said collector providing a second complementary output, and said emitter being connected to said emitter of said first transistor;
    a first resistor having a first terminal connected between said emitters of said first and second transistors and a first source of operating voltage for said transistors; and
    a first capacitor connected in parallel with said first resistor;
    whereby a predetermined one of said first and second complementary outputs provides said control signal.

2. The circuit of claim 1, further comprising a differential amplifier interposed between said complementary outputs and said RF amplifier, and responsive to said first and second complementary outputs for providing said control signal.

3. The circuit of claim 2, wherein said differential amplifier comprises an operational amplifier.

4. The circuit of claim 1 wherein said first and second transistors have a common substrate.

5. The circuit of claim 1, further comprising:
    a second resistor connected between said collector of said first transistor and a second source of operating voltage; and
    a third resistor connected between said collector of said second transistor and said second source of operating voltage.

6. The circuit of claim 5, further comprising:
    a second capacitor connected between the collector of said first transistor and said first source of operating voltage; and
    a third capacitor having a first terminal connected between the collector of said second transistor and said first source of operating voltage.

7. A circuit for providing a control signal to select the output power of a radio frequency (RF) amplifier, comprising:
    a first transistor having a base, an emitter, and a collector, said base being connected to a reference signal and said collector providing a first complementary output;
    a second transistor having a base, an emitter, and a collector, said base being functionally connected to the output of said RF amplifier, said collector providing a second complementary output and said emitter being connected to said emitter of said first transistor, said first and second transistors having a common substrate;
    a first resistor connected between said emitters of said first and second transistors and a first source of operating voltage;
    a first capacitor connected in parallel with said first resistor;
    a second resistor connected between said collector of said first transistor and a second source of operating voltage;
    a third resistor connected between said collector of said second transistor and said second source of operating voltage;
    a second capacitor connected between said collector of said first transistor and said first source of operating voltage
    a third capacitor connected between said collector of said second transistor and said first source of operating voltage; and
    a predetermined one of said first and second complementary outputs providing said control signal.

8. A circuit as recited in claim 7, further comprising an amplifier having an inverting input, a noninverting input, and an output, a selected one of said inputs being connected to said first complementary output, the other one of said inputs being connected to said second complementary output, and said output providing said control signal.

* * * * *